(12) United States Patent
Wilson et al.

(10) Patent No.: US 8,301,990 B2
(45) Date of Patent: Oct. 30, 2012

(54) PROGRAMMABLE COMPUTE UNIT WITH INTERNAL REGISTER AND BIT FIFO FOR EXECUTING VITERBI CODE

(75) Inventors: James Wilson, Foxboro, MA (US); Yosef Stein, Sharon, MA (US); Gregory Yukna, Norton, MA (US); Lewis Lahr, Dover, MA (US)

(73) Assignee: Analog Devices, Inc., Norwood, MA (US)

( * ) Notice: Subject to any disclaimer, the term of this patent is extended or adjusted under 35 U.S.C. 154(b) by 1280 days.

(21) Appl. No.: 11/904,341

(22) Filed: Sep. 27, 2007

(65) Prior Publication Data

US 2009/0089649 A1    Apr. 2, 2009

(51) Int. Cl.
*H03M 13/03*    (2006.01)

(52) U.S. Cl. ........................................ 714/795

(58) Field of Classification Search .................... 714/795
See application file for complete search history.

(56) References Cited

U.S. PATENT DOCUMENTS

| | | |
|---|---|---|
| 3,303,477 A | 2/1967 | Voigt |
| 3,805,037 A | 4/1974 | Ellison |
| 3,959,638 A | 5/1976 | Blum et al. |
| 4,757,506 A * | 7/1988 | Heichler ..................... 714/795 |
| 5,031,131 A | 7/1991 | Mikos |
| 5,062,057 A | 10/1991 | Blacken et al. |
| 5,101,338 A | 3/1992 | Fujiwara et al. |
| 5,260,898 A | 11/1993 | Richardson |
| 5,287,511 A | 2/1994 | Robinson et al. |
| 5,351,047 A | 9/1994 | Behlen |
| 5,386,523 A | 1/1995 | Crook et al. |
| 5,530,825 A | 6/1996 | Black et al. |
| 5,537,579 A | 7/1996 | Hiroyuki et al. |
| 5,666,116 A | 9/1997 | Bakhmutsky |
| 5,675,332 A | 10/1997 | Limberg |
| 5,689,452 A | 11/1997 | Cameron |
| 5,696,941 A | 12/1997 | Jung et al. |
| 5,710,939 A | 1/1998 | Ballachino et al. |
| 5,819,102 A | 10/1998 | Reed et al. |
| 5,832,290 A | 11/1998 | Gostin et al. |

(Continued)

FOREIGN PATENT DOCUMENTS

JP    04092921    3/1992

(Continued)

OTHER PUBLICATIONS

English translation of Office Action for Japanese Patent Application No. 2008537761, mailed Mar. 8, 2011, 5 pages.

(Continued)

*Primary Examiner* — John Trimmings
*Assistant Examiner* — Daniel McMahon
(74) *Attorney, Agent, or Firm* — Bingham McCutchen LLP (57) ABSTRACT

A programmable compute unit with an internal register with a bit FIFO for executing Viterbi code is configured to accumulate in the forward path the best-path to each state in an internal register and store the survivor trace back information bit for each state in each stage in a bit FIFO; and in the trace back, selecting the optimal best-path through the Viterbi trellis by tracing through the bit trace back information survivor bits beginning with the survivor bit of the last stage path; and generating in response to the Viterbi constrain length and a current bit FIFO address, the next bit FIFO address and decoded output bit for the next previous stage.

17 Claims, 9 Drawing Sheets

U.S. PATENT DOCUMENTS

| | | | |
|---|---|---|---|
| 5,937,438 | A | 8/1999 | Raghunath et al. |
| 5,961,640 | A | 10/1999 | Chambers et al. |
| 5,970,241 | A | 10/1999 | Deao et al. |
| 5,996,057 | A | 11/1999 | Scales, III et al. |
| 5,996,066 | A | 11/1999 | Yung |
| 6,009,499 | A | 12/1999 | Koppala |
| 6,029,242 | A | 2/2000 | Sidman |
| 6,061,749 | A | 5/2000 | Webb et al. |
| 6,067,609 | A | 5/2000 | Meeker et al. |
| 6,094,726 | A | 7/2000 | Gonion et al. |
| 6,134,676 | A | 10/2000 | VanHuben et al. |
| 6,138,208 | A | 10/2000 | Dhong et al. |
| 6,151,705 | A | 11/2000 | Santhanam |
| 6,223,320 | B1 | 4/2001 | Dubey et al. |
| 6,230,179 | B1 | 5/2001 | Dworkin et al. |
| 6,263,420 | B1 | 7/2001 | Tan et al. |
| 6,272,452 | B1 | 8/2001 | Wu et al. |
| 6,272,661 | B1 * | 8/2001 | Yamaguchi ............... 714/795 |
| 6,285,607 | B1 | 9/2001 | Sinclair |
| 6,289,487 | B1 | 9/2001 | Hessel et al. |
| 6,292,923 | B1 * | 9/2001 | Genrich et al. ............ 714/795 |
| 6,332,188 | B1 | 12/2001 | Garde et al. |
| 6,430,672 | B1 | 8/2002 | Dhong et al. |
| 6,480,845 | B1 | 11/2002 | Egolf et al. |
| 6,539,477 | B1 | 3/2003 | Seawright |
| 6,587,864 | B2 | 7/2003 | Stein et al. |
| 6,757,806 | B2 | 6/2004 | Shim |
| 6,771,196 | B2 | 8/2004 | Hsiun |
| 6,829,694 | B2 | 12/2004 | Stein et al. |
| 7,173,985 | B1 | 2/2007 | Diaz-Manero et al. |
| 7,187,729 | B2 | 3/2007 | Nagano |
| 7,243,210 | B2 | 7/2007 | Pedersen et al. |
| 7,331,013 | B2 | 2/2008 | Rudosky et al. |
| 7,424,597 | B2 | 9/2008 | Lee et al. |
| 7,673,224 | B2 * | 3/2010 | Chakraborty ............. 714/795 |
| 7,728,744 | B2 | 6/2010 | Stein et al. |
| 7,861,146 | B2 * | 12/2010 | Watanabe et al. .......... 714/795 |
| 7,882,284 | B2 * | 2/2011 | Wilson et al. ............... 710/52 |
| 2003/0085822 | A1 | 5/2003 | Scheuermann |
| 2003/0103626 | A1 | 6/2003 | Stein et al. |
| 2003/0133568 | A1 | 7/2003 | Stein et al. |
| 2003/0149857 | A1 | 8/2003 | Stein et al. |
| 2003/0196072 | A1 | 10/2003 | Chinnakonda et al. |
| 2003/0229769 | A1 | 12/2003 | Montemayor |
| 2004/0145942 | A1 | 7/2004 | Leijten-Nowak |
| 2004/0193850 | A1 | 9/2004 | Lee et al. |
| 2004/0210618 | A1 | 10/2004 | Stein et al. |
| 2005/0086452 | A1 | 4/2005 | Ross |
| 2005/0228966 | A1 | 10/2005 | Nakamura |
| 2005/0267996 | A1 | 12/2005 | O'Connor et al. |
| 2006/0143554 | A1 * | 6/2006 | Sudhakar et al. .......... 714/795 |
| 2006/0271763 | A1 | 11/2006 | Pedersen et al. |
| 2007/0044008 | A1 | 2/2007 | Chen et al. |
| 2007/0089043 | A1 | 4/2007 | Chae et al. |
| 2007/0094474 | A1 | 4/2007 | Wilson et al. |
| 2007/0094483 | A1 | 4/2007 | Wilson et al. |
| 2007/0277021 | A1 * | 11/2007 | O'Connor et al. .......... 712/208 |
| 2008/0010439 | A1 | 1/2008 | Stein et al. |
| 2008/0244237 | A1 | 10/2008 | Wilson et al. |

FOREIGN PATENT DOCUMENTS

| | | |
|---|---|---|
| JP | 06110852 | 4/1994 |
| JP | 2001210357 | 8/2001 |
| JP | 02290494 | 10/2002 |
| JP | 05513541 | 5/2005 |
| WO | WO-96/10226 | 4/1996 |
| WO | WO-03/067364 | 8/2003 |

OTHER PUBLICATIONS

Examination Report for European Patent Application No. 06817002.6 mailed Sep. 16, 2009, 5 pages.

Examination Report for European Patent Application No. 06817042.2 mailed May 26, 2010, 6 pages.

English translation of Office Action for Taiwan Patent Application No. 095139563, mailed Jul. 14, 2010, 7 pages.

English translation of Office Action for Chinese Patent Application No. 200680039988.6, mailed Dec. 4, 2009, 4 pages.

English translation of Office Action for Chinese Patent Application No. 200680047898.1, mailed Jan. 8, 2010, 5 pages.

Examination Report for European Patent Application No. 06817042.2, mailed May 26, 2010, 6 pages.

English translation of Office Action for Chinese Patent Application No. 200680039988.6, mailed Jun. 10, 2010, 6 pages.

U.S. Appl. No. 11/728,358, filed Mar. 27, 2007, Wilson et al.

Rasheed, Rizwan et al., *Reconfigurable Viterbi Decoder for Mobile Platform*, Mobile Communications Department, Institut Eurecom, Sophia Antipolis, France, 6 pages.

Hendrix, Harry, *Viterbi Decoding Techniques for the TMS32054x DSP Generation*, Texas Instruments, Application Report SPRA071A—Jan. 2002, pp. 1-8.

"Microsoft Computer Dictionary", 2002, Microsoft Press, 5th ed., p. 474.

Citron et al. "Accelerating Multi-Media Processing by Implementing Memoing in Multiplication and Division Units," ACM SIGPLAN Notices, ACM, Association for Computer Machinery, NY, NY, vol. 33, No. 11, Nov. 1998, pp. 252-261.

Goslin, "A Guide to Using Field Programmable Gate Arrays (FPGAs) for Application-Specific Digital Signal Processing Performance," [online], Xilinx, Dec. 1995 [retrieved Aug. 19, 2009]. Retrieved from the Internet: <http://www.xilinx.com/appnotes/dspguide.pdf>, 11 pages.

Hennessy et al. "Computer Organization and Design: The Hardware/Software Interface" Morgan Kaufmann Publishers, Inc., 2nd ed., 1997, pp. 449-465.

Intel, Pentium Processor Family Developer's Manual, [online], vol. 3, Architecture and Programming Manual, 1995, [retrieved Dec. 7, 2009]. Retrieved from the Internet: <http://download.intel.com/design/pentium/MANUALS/24143004.pdf>, retrieved Dec. 7, 2009, 1032 pages.

Richardson, "Exploiting Trivial and Redundant Computation," Computer Arithmetic, 1993, Proceedings, 11th Symposium on Windsor, Ont. Canada, Jun. 29-Jul. 2, 1983, Los Alamitos, CA, USA, IEEE Comput. Soc., Jun. 1993, pp. 220-227.

Yadav et al., "Software-Only Multiple Variable Length Decoding for Real-Time Video on MDSP," International Conference on Consumer Electronics, 2005, ICCE, 2005 Digest of Technical Papers, Jan. 8-12, 2005, DOI: 0-7803-8838-0/05 2005, pp. 141-142.

International Search Report for International Application No. PCT/US2006/040510, mailed Oct. 17, 2007, 2 pages.

Written Opinion for International Application No. PCT/US2006/040510, mailed Oct. 17, 2007, 9 pages.

Supplementary European Search Report and Opinion for European Patent Application No. 06817042.2, mailed Nov. 17, 2008, 8 pages.

English translation of Office Action for Chinese Patent Application No. 200680039988.6, mailed Jun. 19, 2009, 7 pages.

International Search Report for International Application No. PCT/US2008/010524, mailed Nov. 28, 2008, 1 page.

Written Opinion for International Application No. PCT/US2008/010524, mailed Nov. 28, 2008, 7 pages.

International Search Report for International Application No. PCT/US2006/040414, mailed Oct. 1, 2007, 1 page.

Written Opinion for International Application No. PCT/US2006/040414, mailed Oct. 1, 2007, 7 pages.

English translation of Office Action for Taiwan Patent Application No. 095139557, mailed Sep. 29, 2009, 5 pages.

Supplementary European Search Report and Opinion for European Patent Application No. 06817002.6, mailed Mar. 17, 2009, 5 pages.

International Search Report for International Application No. PCT/US2008/002914, mailed Jun. 27, 2008, 1 page.

Written Opinion for International Application No. PCT/US2008/002914, mailed Jun. 27, 2008, 4 pages.

International Search Report for International Application No. PCT/US2008/010571, mailed Nov. 25, 2008, 2 pages.

Written Opinion for International Application No. PCT/US2008/010571, mailed Nov. 25, 2008, 4 pages.

English translation of Office Action for Japanese Patent Application No. 2008537767, mailed Aug. 2, 2011, 7 pages.
English translation of Examination Report in Taiwan Patent Application No. 097136356, mailed Oct. 12, 2011, 4 pages.
Wang et al., "An Artificial Neural Net Viterbi Decoder," IEEE Transactions on Communications, vol. 44, No. 2 (Feb. 1996).
Kubota et al., "Novel Viterbi Decoder VLSI Implementation and its Performance," IEEE Transactions on Communications, vol. 41, No. 8 (Aug. 1993).

* cited by examiner

PROGRAMMABLE COMPUTE UNIT WITH INTERNAL REGISTER AND BIT FIFO FOR EXECUTING VITERBI CODE

FIELD OF THE INVENTION

This invention relates to a programmable compute unit with an internal register and bit FIFO for executing Viterbi code.

BACKGROUND OF THE INVENTION

The Viterbi decoding algorithm, known to be a maximum-likelihood algorithm, is widely used to decode convolutional codes. Convolutional coding is a bit-level coding technique rather than block-level techniques such as Reed-Solomon coding. In communication applications convolutional codes are advantages over block-level codes as the system gain degrades gracefully as the error rate increases, while block codes correct errors up to a point, after which the gain drops rapidly. Convolutional codes are decoded after an arbitrary length of data, while block codes introduce latency of an entire data block, convolutional codes do not require any block synchronization. Convolutionally encoded data is decoded through knowledge of the possible state transitions, created from the dependence of the current symbol on the past data. The allowable state transitions are represented by a trellis diagram. The Viterbi decoding algorithm involves the calculation of a Hamming distance between the received signal and the branches leading to each trellis state. At each trellis state, the path metric is stored. The actual decoding is accomplished by tracing the maximum likelihood path backwards through the trellis. A longer sequence results a more accurate reconstruction of the trellis such that in shorter sequences minimum path lengths give optimal results where in longer path lengths nearly all paths provide a solution as convergence is more and more attained. After a sequence of about five times the constraint length little accuracy is gained by additional inputs. The survivor path is determined during the trace back, and the output is generated. The number of trellis states amounts to $2^{k-1}$ with constraint length of k.

Most digital signal processors are designed to manipulate data having a fixed word size (e.g., 8-bit, 16-bit or 32-bit words). When the processor needs to manipulate non-standard word sizes the processor efficiency drops due to the pipeline overhead for each retrieved bit. For example, when a 50 Mbit bit stream needs to be Viterbi error corrected a substantial percentage of the DSP is consumed by this single function.

In Viterbi decoding, on the forward pass, the minimum Hamming distance is accumulated and the survivor bit is stored for each state in each stage. Then the survivor bit path is generated during trace back. Conventional implementations can be in hardware or software. Hardware implementations are fast, able in some cases to accomplish trace back for each stage in a single cycle, but they are generally hardwired to a particular Viterbi application and not easily adapted to other applications. Software implementations are more flexible but much slower requiring many cycles of operation per stage in trace back. Attempts to increase speed generally resort to rearrangement or re-ordering of the accumulate-compare-select and trace back operations.

BRIEF SUMMARY OF THE INVENTION

It is therefore an object of this invention to provide an improved programmable compute unit with an internal register and bit FIFO for executing Viterbi decode.

It is a further object of this invention to provide such an improved programmable compute unit which operates with the speed and efficiency of hardware, e.g. ASIC implementation and flexibility of software implementation.

It is a further object of this invention to provide such an improved programmable compute unit which is easily adapted for a variety of Viterbi parameters.

It is a further object of this invention to provide such an improved programmable compute unit which generates the survivor bit path (Trace back) in a single cycle per stage.

It is a further object of this invention to provide such an improved programmable compute unit which is executable in a conventional compute unit using internal LUT/FIFO(s) for storing survivor bits and generating trace back survivor bit addresses and decoded bits.

The invention results from the realization that an improved programmable compute unit, which operates with the speed and efficiency of hardware implementation yet the flexibility of software implementation, can be achieved using a programmable compute unit with an internal register and internal bit FIFO for executing Viterbi decode configured to, in the forward path, accumulate the best-path to each state in an internal register and store the survivor trace back information bit for each state in each stage in a bit FIFO and in the trace back path selecting the optimal best-path through the Viterbi trellis by tracing through the bit FIFO trace back information survivor bits beginning with the survivor bit of the last stage best-path and generating in response to the Viterbi constrain length and the current bit FIFO address the next bit FIFO address and decoded output bit for the next previous stage.

The subject invention, however, in other embodiments, need not achieve all these objectives and the claims hereof should not be limited to structures or methods capable of achieving these objectives.

This invention features a programmable compute unit with an internal register and a bit FIFO for executing Viterbi decode configured to: in the forward path accumulate the best-path to each state in an internal register and store the survivor trace back information bit for each state in each stage in a bit FIFO. In the trace back path the optimal best-path is selected through the Viterbi trellis by tracing through the bit FIFO trace back information survivor bits beginning with the survivor bit of the last stage best-path. In response to the Viterbi constrain length and a current bit FIFO address, there is generated the next bit FIFO address and the decoded output bit for the next previous stage.

In a preferred embodiment the FIFO address may include a stage field and new state field. The stage field will be updated by the number of states per stage to point to the beginning of the next trace back stage. The next previous state may be the current state shifted by one and the next previous survivor trace back information bit may be deposited as the new decoded output bit. The bit FIFO may fill and spill an external memory using 32 bit words. The 32 bit words may be memory aligned. The internal register may be one of the compute unit register files.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
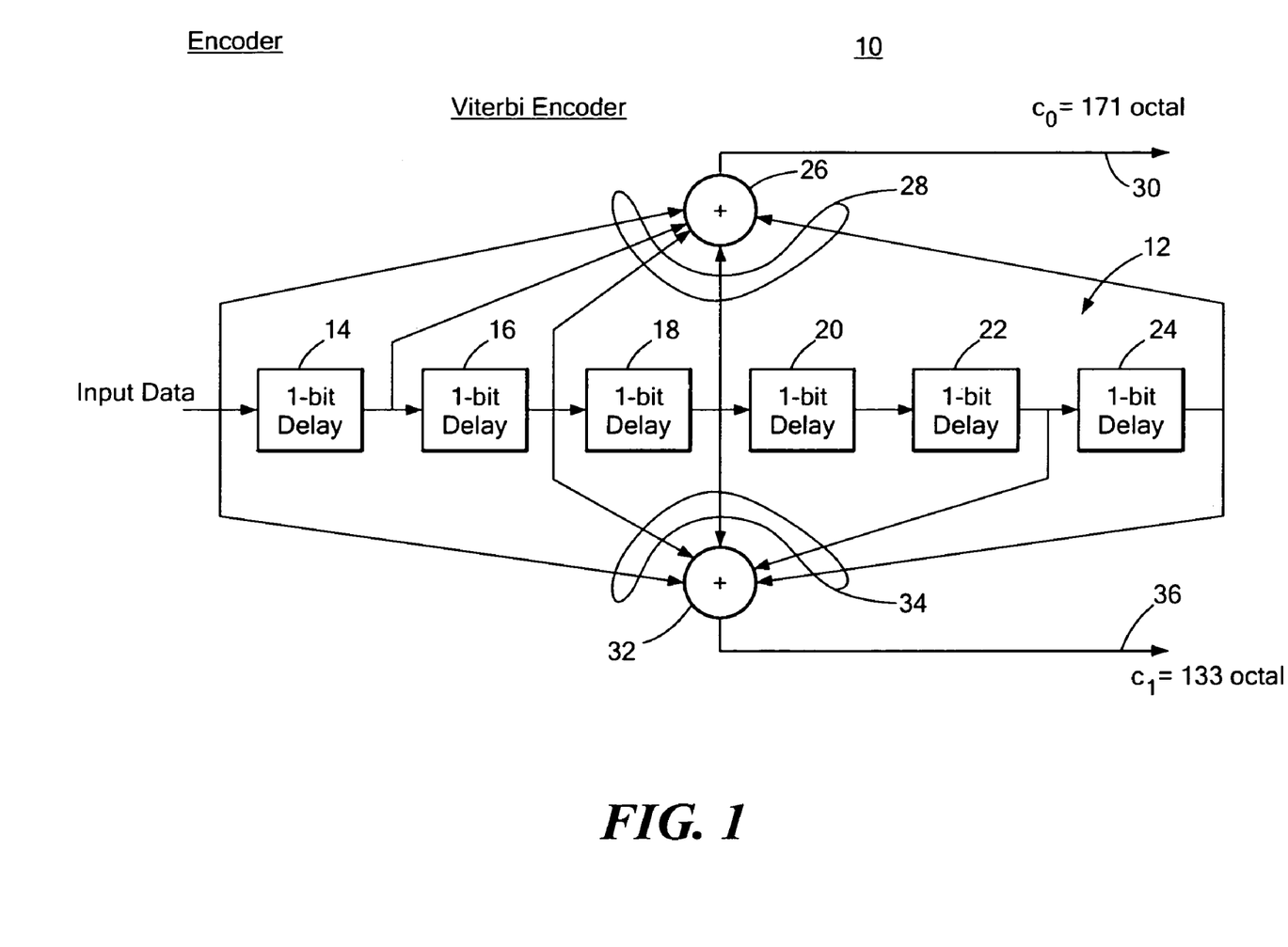
FIG. 1 is a schematic diagram of a prior art Viterbi encoder.

There is shown in FIG. 1 a conventional Viterbi encoder 10 which is shown simplified using a delay line 12 including just a six one bit delays 14, 16, 18, 20, 22 and 24. Each bit of input data be it one or zero is submitted to delay line 12 and propagates through one bit at a time. As each bit arrives two convolutions are performed. One by exclusive OR circuit 26 having inputs 28 to provide one output 30 and another by exclusive OR circuit 32 having inputs 34 to provide a second output 36.

Figure 2:
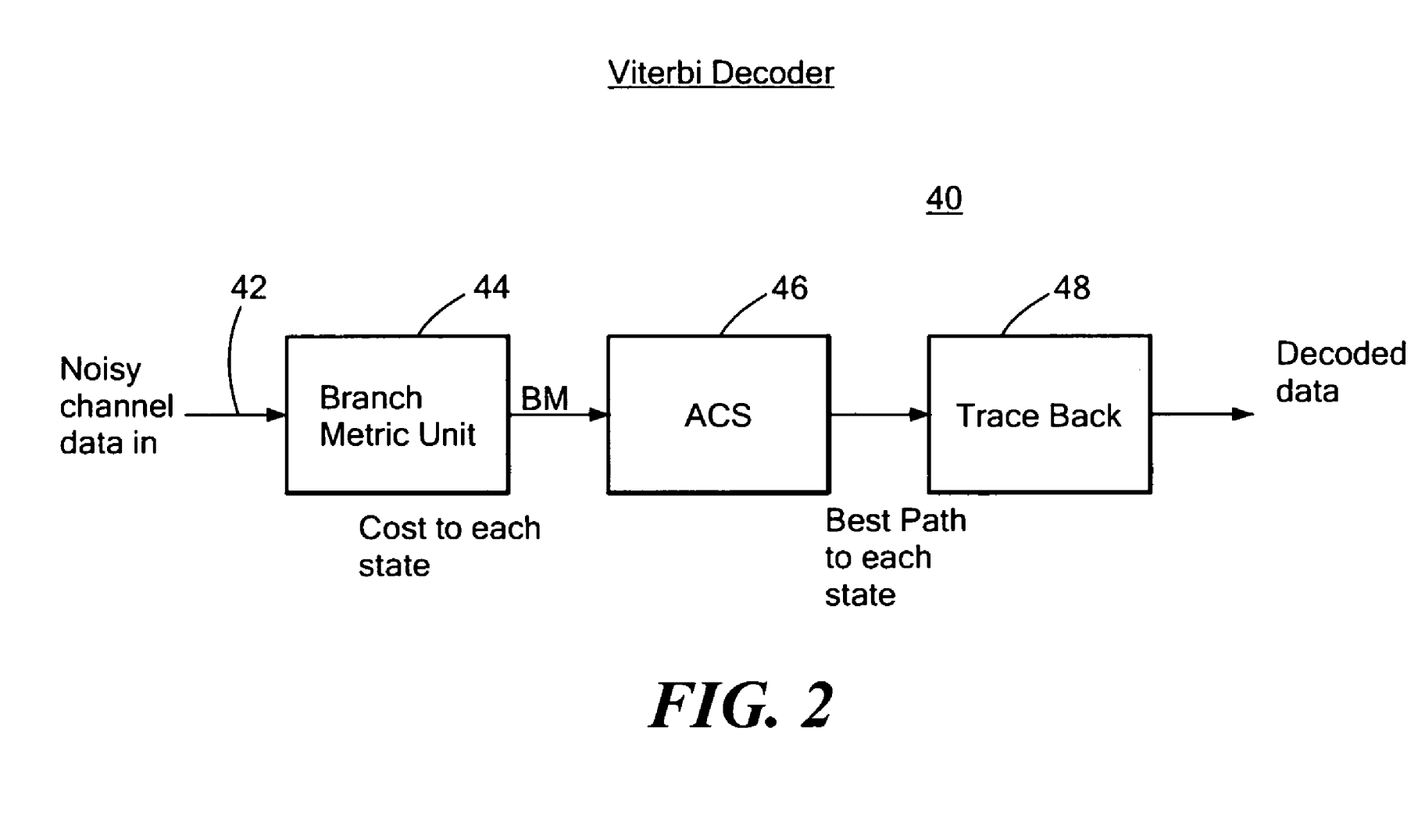
FIG. 2 is a schematic block diagram of a prior art Viterbi decoder.

Viterbi encoder 10, FIG. 1, is shown simplified for purposes of explanation and so too is the explanation of Viterbi decoder 40, FIG. 2. A fuller explanation of Viterbi coding and implementations for accomplishing it are well known and can be widely found in the literature, a recent sampling of which includes RECONFIGURABLE VITERBI DECODER FOR MOBILE PLATFORM, by Riswan Rasjeed et al., Mobile Communications Department, Institu Eurecom, Sophia Antipolis, France; VITERBI DECODING TECHNIQUES FOR THE TMS320C54X DSP GENERATION, Texas Instruments, Application Report SPRA071A, January 2002, pgs 1-8; U.S. Pat. No. 7,173,985, Diaz-Mareno et al., entitled: METHOD AND APPARATUS FOR IMPLEMENTING A VITERBI DECODER; U.S. Pat. No. 7,187,729, Nagano, entitled VITERBI DECODER; U.S. Patent Application Publication US2007/0044008A1, Chen et al., entitled: ACS CIRCUIT AND VITERBI DECODER WITH THE CIRCUIT; and U.S. Patent Application Publication US2007/0089043A1, Chae et al, entitled: VITERBI DECODER AND VITERBI DECODING METHOD, each of which is hereby incorporated in its entirety by this reference.

In Viterbi decoder 40 the noisy channel data arrives at input 42 to branch metric unit 44 here the cost to each state is determined and delivered to the add, compare select (ACS) circuit 46 which accumulates the cost to each state, compares them and selects the least costly in terms of the shortest Hamming distance as the state survivor path. By applying the ACS to all states in a stage the stage survivor decision word is generated. Typically, then, the shortest best-path is chosen as the optimal best-path to use for the trace back operation indicated at 48. In trace back the survivor decision word bits are used to trace backwards the maximum likelihood path through the Viterbi trellis, which reconstructs the bit sequence with the highest probability of matching the transmitted sequence. Typically Viterbi decoding uses a number of stages, each stage including a number of states. The states may be 16, 64, 128, 256. Likewise the number of stages in a decoded window may be in the tens, hundreds, or thousands. When a few number of stages are involved the optimal path is typically chosen as the shortest best-path, but when many stages are involved the convergence of the Viterbi approach is such that any of the best-paths, whether it be the shortest best-path or not, will through trace back arrive at the most likely value for the decoded bit.

Figure 3:
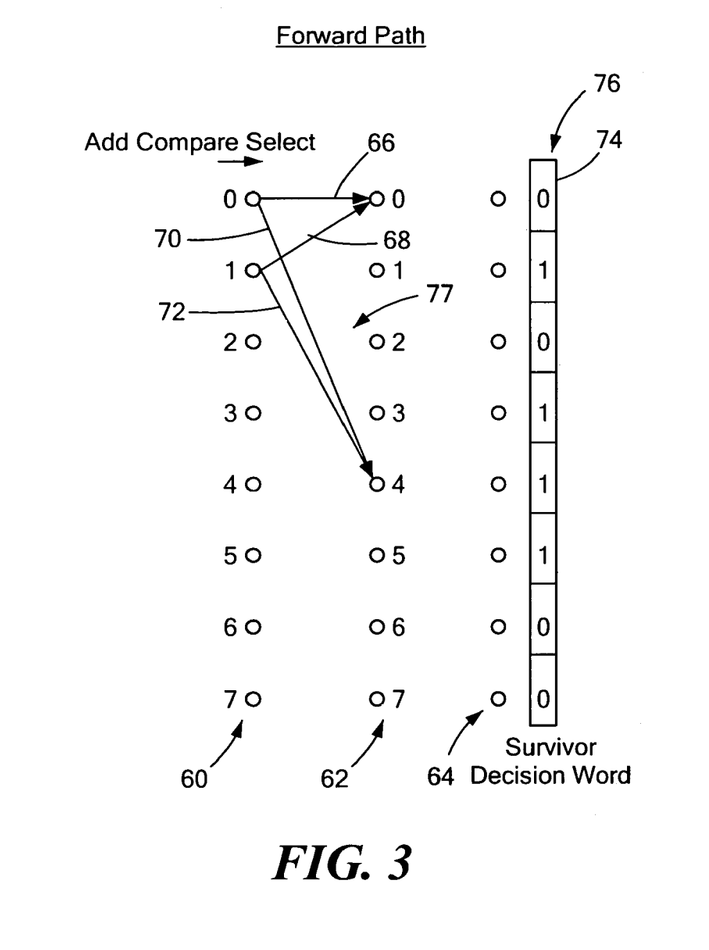
FIG. 3 is a diagram of a portion of a Viterbi trellis and survivor decision word occurring in the forward path.
Figure 3A:
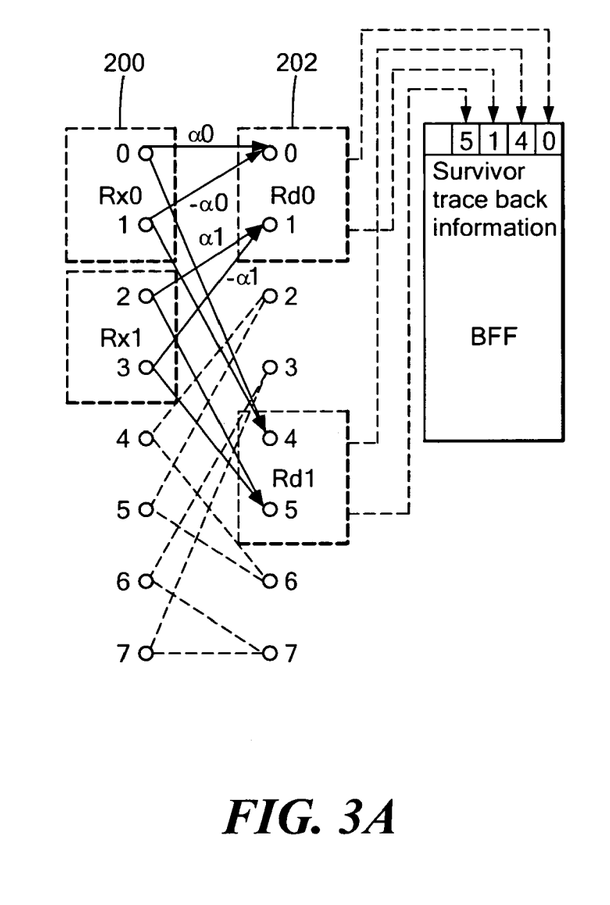
Figure 4:
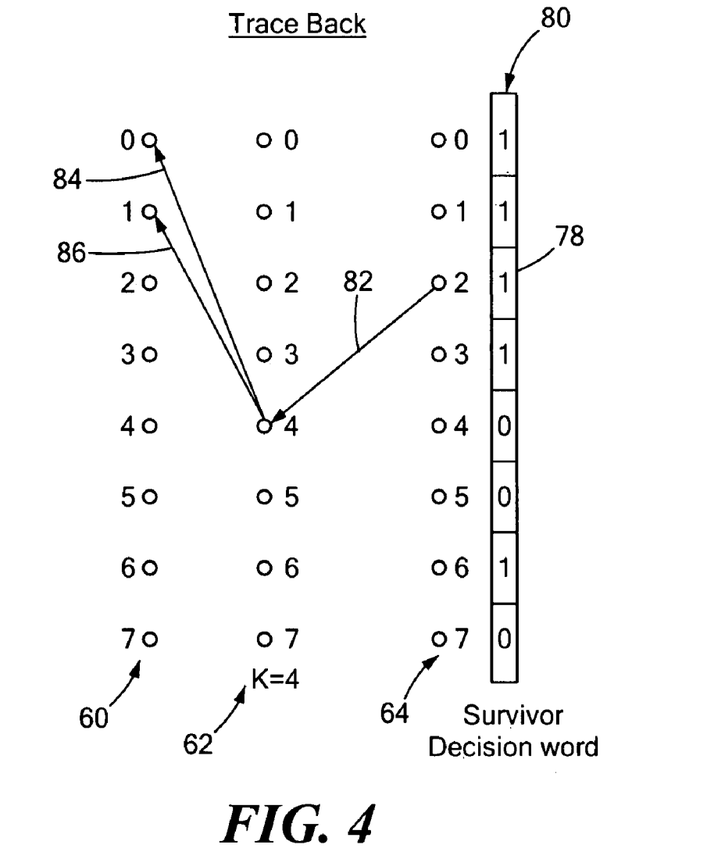
FIG. 4 is a diagram of a portion of a Viterbi trellis and survivor decision word occurring in the trace back.
Figure 4A:
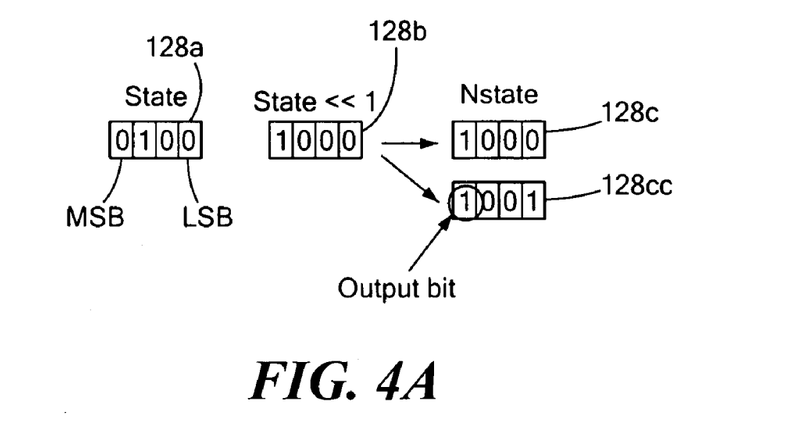

The forward path operation for k=3 is shown in diagrammatic form in FIG. 3, there are three stages 60, 62, and 64, each of which contains eight states 0-7. Referring now to FIG. 2 and FIG. 3 together, branch metric unit 44 determines the cost to each state, line 66, 68, and lines 70, and 72. ASC 46 then determines the shortest or the lowest cost to each state or shortest Hamming distance. In this case, assume that this is 66, and so a zero is placed in the associated bit 74 of survivor decision word 76. This continues for all of the 0-7 states in each stage 60, 62, 64, creating what is known as a Viterbi trellis 77. A survivor decision word 76 is created for each stage so that a path is remembered for each path through the Viterbi trellis 77. At the end of the forward path (ACS) operation the decoder seeks the optimal path, for example, the shortest path of accumulated Hamming distances and begins the trace back as shown in FIG. 4, starting with the survivor bit 78 of the last survivor decision word 80 and working back from stage to stage to arrive at the most likely decoded data bit by following the path lines 82, 84, 86.

Figure 5:
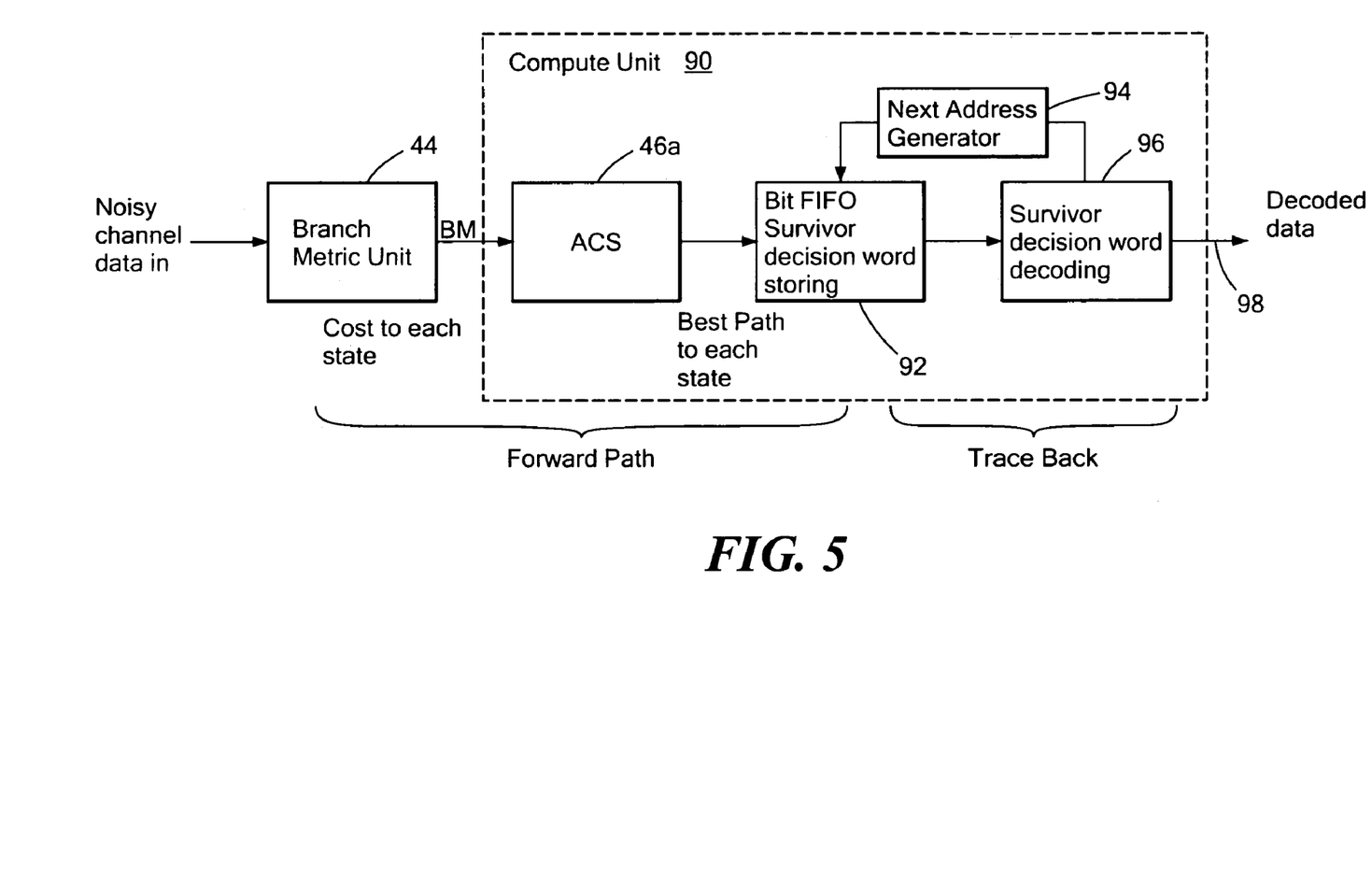
FIG. 5 is a schematic block diagram of programmable compute unit with internal register and bit FIFO according to this invention.

In accordance with this invention branch metric unit 44, FIG. 5, is followed by one or more compute units 90 which includes the ACS 46a as well as a bit FIFO for storing survivor decision words 92. In the trace back process a bit FIFO next address generator 94 which uses the survivor decision word 96 to generate the next bit FIFO address and also provide the decoded data bit 98.

Figure 6:
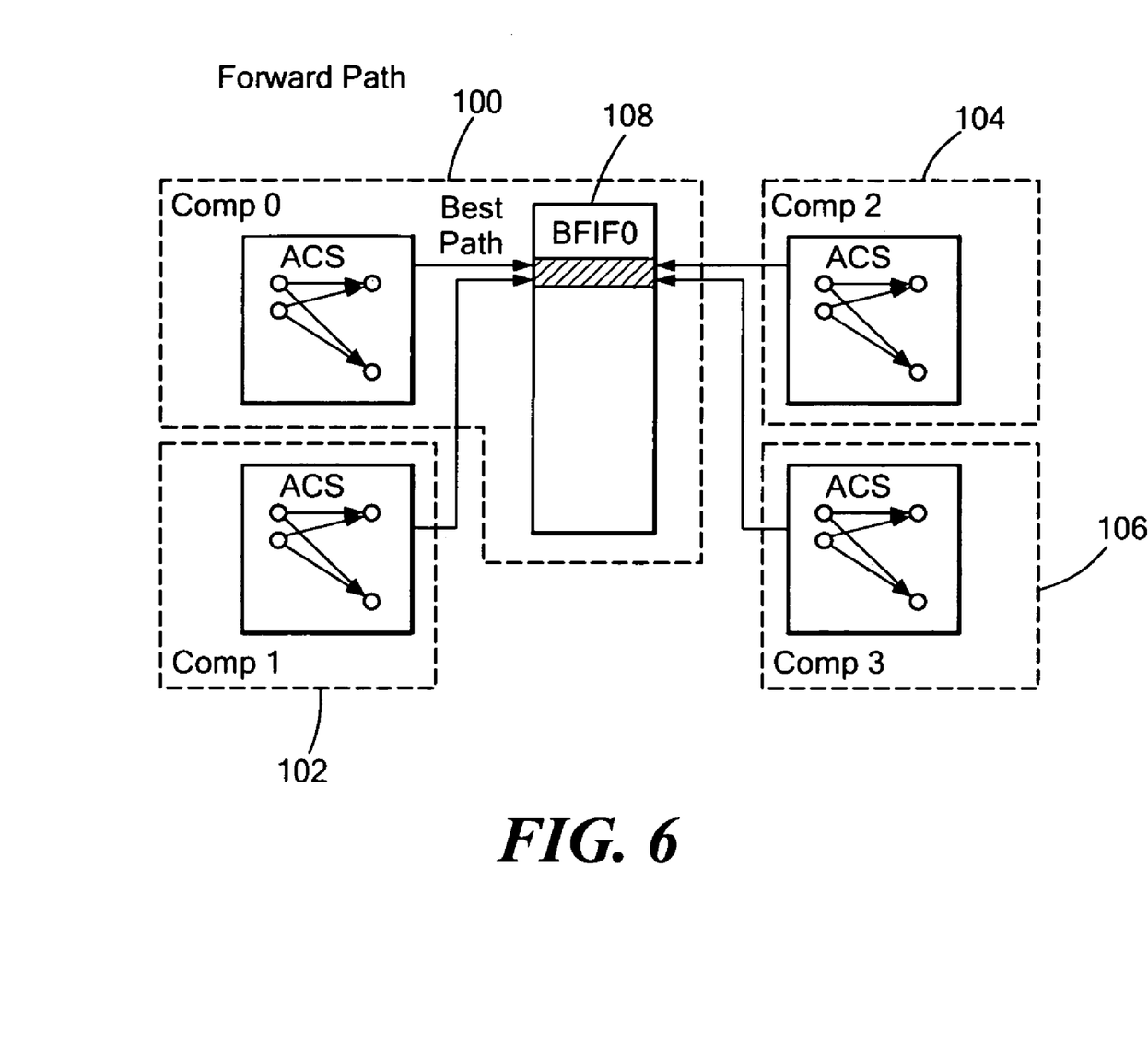
FIG. 6 is a schematic block diagram for compute units performing accumulate-compare-select (ACS) operations and depositing survivor decision words in one or more internal bit FIFO's.

In accordance with this invention FIG. 6, a number of compute units, for example, 100, 102, 104, and 106 may be used together and they may all deliver their survivor decision word bits to the bit FIFO 108 in compute unit 100. When that one is full it may use the bit FIFO unit in compute unit 102 and thence 104 and 106. With the availability of a number of compute units the work may be distributed so that compute unit 100 may service states 0 and 1, compute unit 102 states 2 and 3, compute unit 104 states 4 and 5, and compute unit 106 states 6 and 7.

Figure 7:
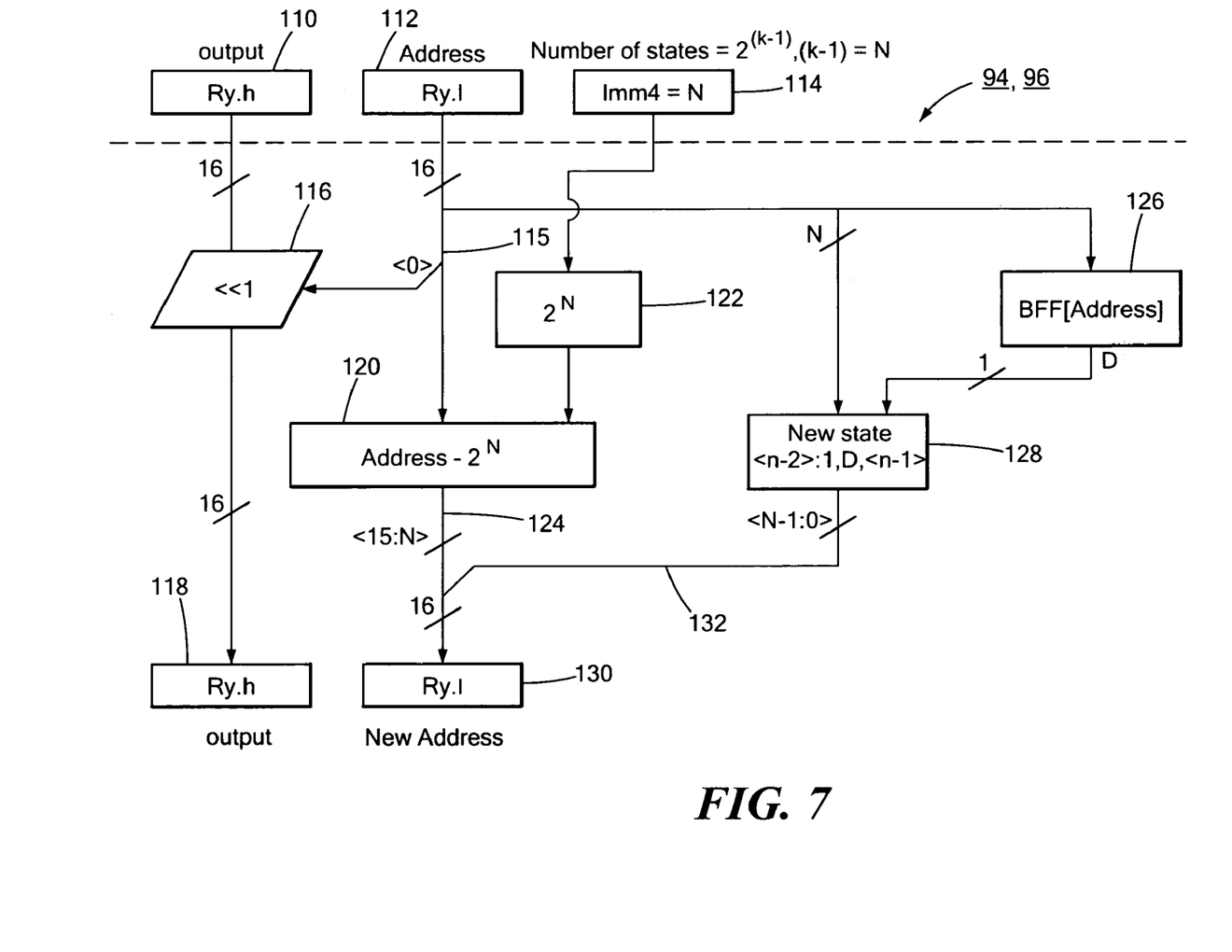
FIG. 7 is a schematic diagram of an address generator of the bit FIFO of FIG. 6.

The next address generator 94 and survivor decision word decoding 96, FIG. 5, are shown in more detail in FIG. 7. There are three registers, the output register 110 which receives the previous decoded output bit, address register 112 which holds the previous address, and the number of states register which holds the Viterbi constraint length. In fact the number of states per stage is two to the power of one less than the Viterbi constraint length. So if there are $8=2^3$ states K=3 and the value in register 114 will be 3. This number can be changed as desired making the system wholly programmable for Viterbi decoding of any constraint length, thus garnering one of the great advantages of software implementations and yet providing the single cycle complete stage processing available only in hardware implementation. The output register 110 is shifted up by one position and the current state shifted out bit address bit <0> on line 115 is deposit as the new output decoded bit at register 118. The present address 112 is updated to the beginning of the next previous stage by subtracting from it at 120 two to the power of one less the Viterbi constrain length 114 or number of states 122 per stage to obtain the next previous stage address 124. The survivor bit from the previous bit FIFO 126 retrieval is used to create the next new state 128, the next new state is created by shifting the current (k−1) state window (where k is the Viterbi constraint length) by one and depositing the new survivor trace back bit as the new bit. The current state may be shifted up or down in accordance with the hardware implementation. The current state shifted out bit (the MSB bit of the (k−1) state window in the shift up case) is deposited as the new decoded output bit in register 110. The updated next new state 128 is added to the address 124 to create the bit level new address 130. In fact the address 124 created at 120 is the stage address, whereas the address created at 128 and presented on line 132 is the new state address. The stage and state address combined provide the new bit FIFO address at 130.

Figure 8:
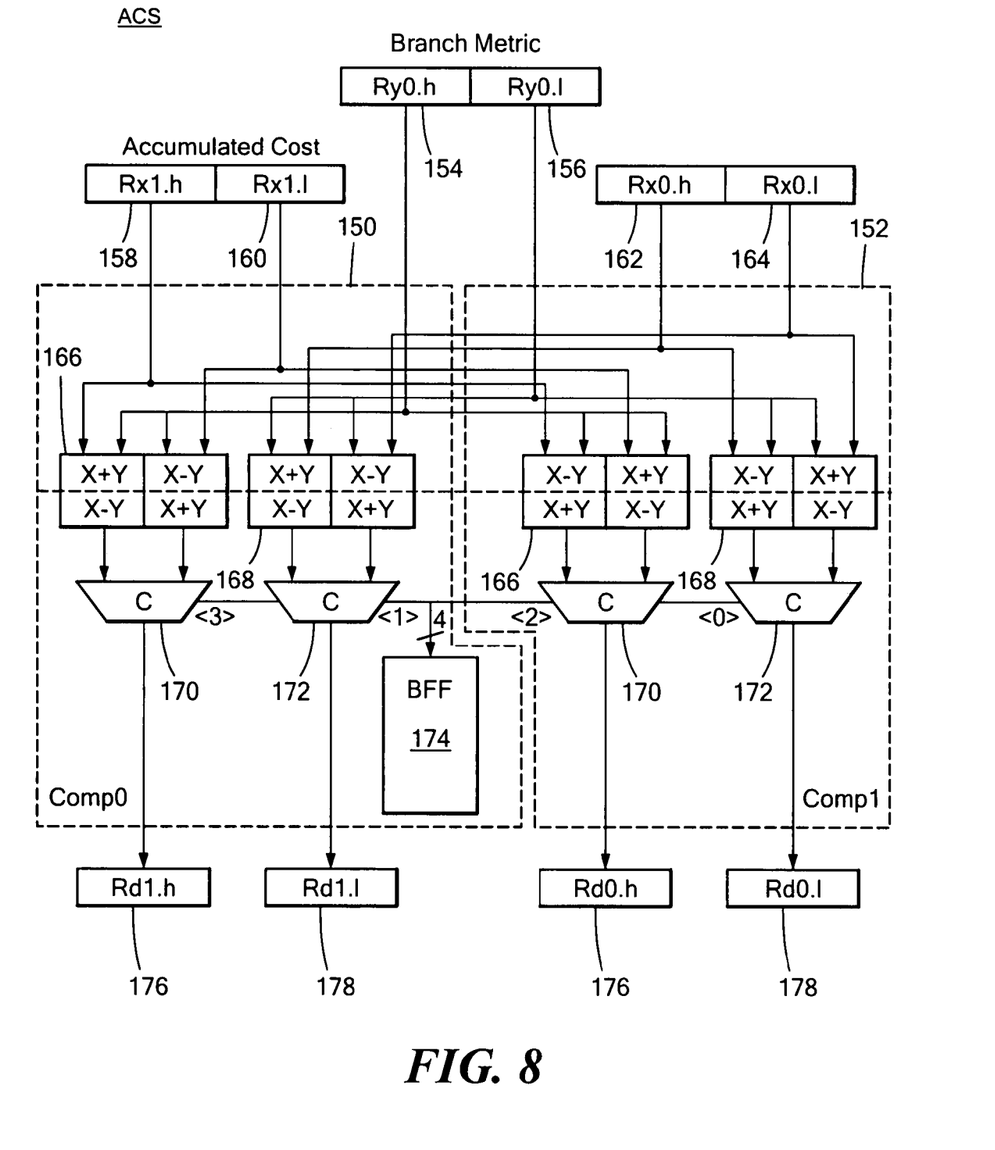
FIG. 8 is a schematic diagram of two compute units configured for this invention.

The invention may be implemented in conventional programmable compute units 150, 152, FIG. 8. Each compute unit responds to the processed state branch metric register 154, 156 and each has a pair of accumulated state cost registers 158, 160, 162, and 164 since each compute unit serves two states. Within each compute unit there are the accumulator functions 166, 168, and the comparator functions 170, 172 for providing to registers 176 and 178 the path with the shortest Hamming distance. The survivor decision bits <0>, <1>, <2> and <3> form the four states 158, 160, 162 and 164 processed by compute unit 150 and 152 are collected by bit FIFO 174 in compute unit 150 typically each compute unit includes such a bit FIFO and both can be used. The accumulated state cost and the branch metrics registers may be implemented with any of the existing compute unit register file. See also co-pending application by one or more of the inventors hereof entitled COMPUTE UNIT WITH AN INTERNAL BIT FIFO CIRCUIT, Ser. No. 11/728,358 filed on Mar. 26, 2007, hereby incorporated in its entirety by this reference.

Figure 9:
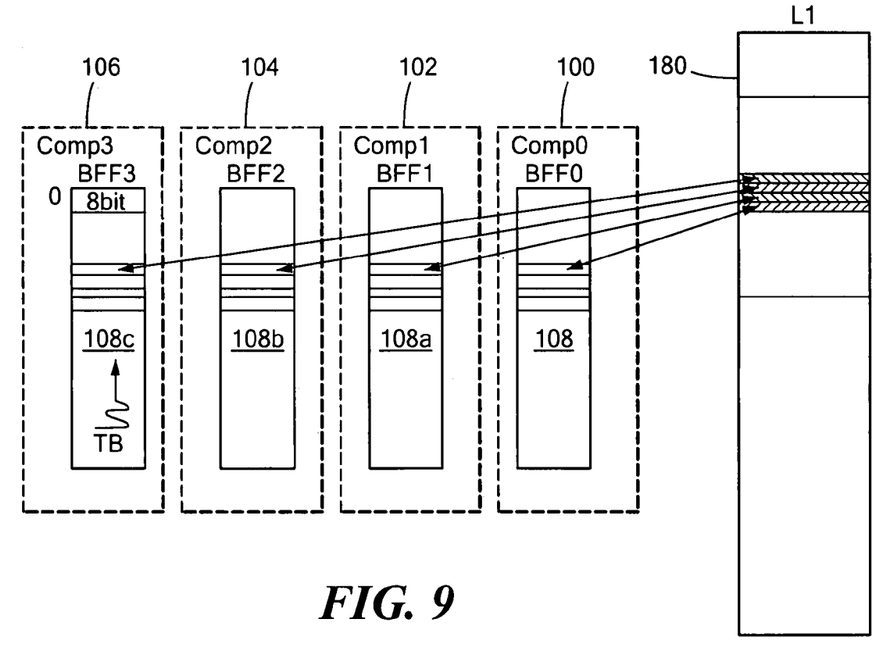
FIG. 9 is a schematic diagram of four compute units with their bit FIFO's arranged to fill and spill to external memory.

In the case where the Viterbi decoded window is larger then the bit FIFO (1K of decision words for k=7), the spill and fill functionality of each bit FIFO 108, 108a, 108b, 108c, FIG. 9, for each compute unit 100, 102, 104, 106, respectively, as shown in FIG. 9 with reference to an LI memory 180 which is external to the compute units may be used to extend the bit FIFO to any required size. Spilling the Bit FIFO on the forward pass (ACS) every time the bit FIFO is out of space and filling it back during the trace back operation as needed.

Figure 10:
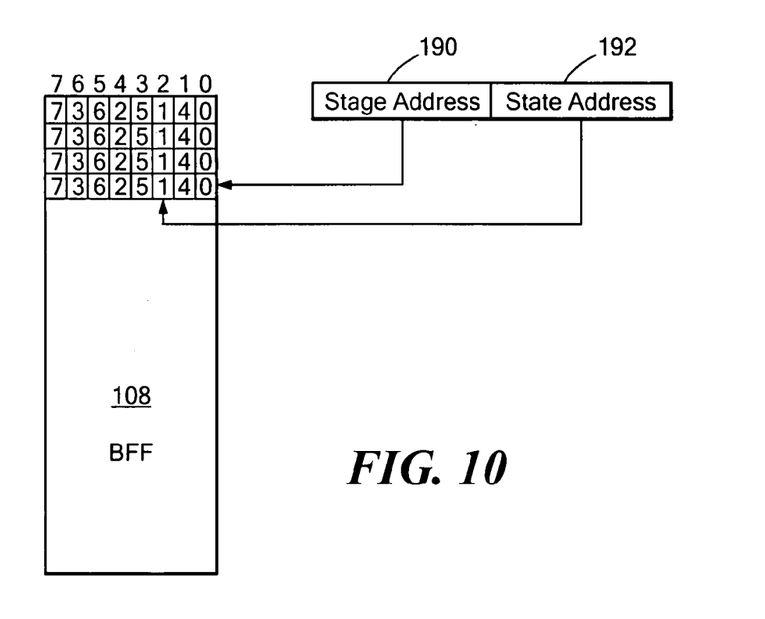
FIG. 10 is a schematic diagram of a bit FIFO address generation from stage and state address.

The generation of the new address from the stage and state portions is illustrated in FIG. 10, where bit FIFO 108 is addressed by the stage address 190 to access the stage survivor word and the state address 192 for the particular state decision bit within the stage.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A programmable compute unit for executing a Viterbi decode, the programmable compute unit comprising:
   forward-path circuitry for (i) accumulating a best path to each state in each stage in a decoded window of received data in an internal register and (ii) storing in a bit FIFO, in parallel, a plurality of survivor trace-back information bits for a plurality of states;
   trace-back circuitry for selecting an optimal best path through a Viterbi trellis comprising the accumulated best paths by reading, one bit at a time, trace-back information bits from the bit FIFO, beginning with a survivor bit of a last-stage best path; and
   output circuitry for generating, in response at least in part to a current bit FIFO address, (i) a next bit FIFO address by subtracting a given Viterbi constraint length factor from higher-order bits of the current bit FIFO address and concatenating, to a result of the subtraction, lower-order bits of the current bit FIFO address and a survivor trace-back information bit and (ii) a decoded output bit for a stage previous to a current stage.

2. The programmable compute unit of claim 1 in which said next bit FIFO address includes a stage field and a new state field.

3. The programmable compute unit of claim 2 in which said stage field is updated by a number of states per stage to thereby point to a beginning of the stage previous to the current stage.

4. The programmable compute unit of claim 2 in which the new state field comprises a new state created by shifting a current state by one and in which a shifted-out bit of the current state is a new decoded output bit.

5. The programmable compute unit of claim 4 in which the new survivor trace back bit is deposited as a new bit in the current state.

6. The programmable compute unit of claim 5 in which the new survivor trace back bit is deposited as a new LSB bit in the current state.

7. The programmable compute unit of claim 1 in which said bit FIFO collects a trace back survivor bit from all of a plurality of compute units.

8. The programmable compute unit of claim 1 in which said bit FIFO fills and spills data to and from an external memory using 32 bit words.

9. The programmable compute unit of claim 8 in which said 32 bit words are memory aligned.

10. The programmable compute unit of claim 1 in which said internal register is a register file in the programmable compute unit.

11. The programmable compute unit of claim 1 in which said current bit FIFO address points to current stage survivor trace back bit information in said bit FIFO needed to generate a previous trellis state.

12. The programmable compute unit of claim 1 further including multiple compute units comprising multiple bit FIFOs.

13. The programmable compute unit of claim 12 in which said multiple bit FIFOs and said single bit FIFO collect trace-back information from all compute units.

14. A system for executing a Viterbi decode on a received window of input data, the system comprising:
- an address register for storing a current address comprising a stage number and a state in a Viterbi trellis, the trellis corresponding to the received window of input data;
- a number-of-states register for storing a given Viterbi constraint length;
- a bit FIFO for storing a plurality of survivor decision words and for providing, given the current address in the address register, one survivor decision bit per cycle;
- a next-address generator for generating a next address based at least in part on the current address, the Viterbi constraint length, and the survivor decision bit by (i) subtracting a given Viterbi constraint length factor from higher-order bits of the current address and (ii) concatenating, to a result of the subtraction, lower-order bits of the current address and the survivor decision bit; and
- an output register for providing a decoded output stream based on bits received from the address register.

15. A method for executing a Viterbi decode on a received window of input data, the method comprising:
- addressing a bit FIFO using a current address to thereby read out a single survivor trace-back information bit;
- generating a next address of a state in a Viterbi trellis, the trellis corresponding to the received window of input data, by:
  - i. subtracting a given Viterbi constraint length factor from higher-order bits of the current address, and
  - ii. concatenating, to a result of the subtraction, lower-order bits of the current address and the survivor decision bit; and
- shifting a bit of a current address into an output register, the output register comprising decoded data.

16. The method claim 15 in which the Viterbi constraint length factor comprises a result of raising two to the power of one less than the Viterbi constraint length or number of states per stage.

17. The method claim 15 in which concatenating the lower-order bits of the current address and the survivor decision bit comprises shifting the result of the subtraction and the lower-order bits of the current address left by one and depositing the new survivor decision bit as the new bit.

* * * * *